(12) United States Patent
Lai et al.

(10) Patent No.: US 9,093,449 B2
(45) Date of Patent: Jul. 28, 2015

(54) APPARATUS AND METHOD FOR CHIP PLACEMENT AND MOLDING

(71) Applicant: TAIWAN SEMICONDUCTOR MANUFACTURING COMPANY, LTD., Hsinchu (TW)

(72) Inventors: Jui Hsieh Lai, Taoyuan (TW); Ying-Hao Kuo, Hsinchu (TW); Kuo-Chung Yee, Taoyuan (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 17 days.

(21) Appl. No.: 14/060,764

(22) Filed: Oct. 23, 2013

(65) Prior Publication Data

US 2015/0108667 A1   Apr. 23, 2015

(51) Int. Cl.

| | |
|---|---|
| H01L 21/44 | (2006.01) |
| H01L 21/48 | (2006.01) |
| H01L 21/50 | (2006.01) |
| H01L 25/00 | (2006.01) |
| H01L 23/31 | (2006.01) |
| H01L 21/56 | (2006.01) |
| H01L 23/00 | (2006.01) |
| B29C 39/26 | (2006.01) |
| B29C 39/10 | (2006.01) |
| B29L 9/00 | (2006.01) |
| B29L 31/34 | (2006.01) |
| B29K 105/00 | (2006.01) |

(52) U.S. Cl.
CPC .............. H01L 25/50 (2013.01); B29C 39/10 (2013.01); B29C 39/26 (2013.01); H01L 21/565 (2013.01); H01L 23/3107 (2013.01); H01L 24/11 (2013.01); H01L 24/14 (2013.01); B29K 2105/0097 (2013.01); B29L 2009/005 (2013.01); B29L 2031/34 (2013.01)

(58) Field of Classification Search
CPC . H01L 21/3105; H01L 21/4825; H01L 21/56; H01L 23/28; H01L 23/488; H01L 23/3185; H01L 23/4951; H01L 23/49531
USPC ......... 438/106, 124, 127, 118, 626, 644, 692, 438/908; 257/678, 729, E21.006, E21.007, 257/E21.077, E21.267, E21.304, E21.499, 257/E21.502, E21.508, E21.243, E21.237
See application file for complete search history.

(56) References Cited

U.S. PATENT DOCUMENTS

| | | | | |
|---|---|---|---|---|
| 5,616,952 | A * | 4/1997 | Nakano et al. | 257/659 |
| 6,134,111 | A * | 10/2000 | Kinsman et al. | 361/704 |
| 8,035,213 | B2 * | 10/2011 | Lee et al. | 257/692 |
| 8,803,326 | B2 * | 8/2014 | Liu et al. | 257/774 |
| 8,901,739 | B2 * | 12/2014 | Fuergut et al. | 257/773 |

* cited by examiner

Primary Examiner — David Nhu
(74) Attorney, Agent, or Firm — Lowe Hauptman & Ham, LLP (57) ABSTRACT

An approach is provided for placing and securing a chip package portion in an aligned position during a curing process. The approach involves providing an apparatus having a first reservoir configured to receive a first chip package, a second reservoir, and a third reservoir. The approach also involves placing the first chip package portion into the first reservoir, the second chip package portion into the second reservoir, and the third chip package portion into the third reservoir. The approach further involves causing the first chip package portion to be secured in a first curing position, the second chip package portion to be secured in a second curing position and the third chip package portion to be secured in a third curing position.

20 Claims, 12 Drawing Sheets

APPARATUS AND METHOD FOR CHIP PLACEMENT AND MOLDING

RELATED APPLICATIONS

This application is related to co-pending U.S. patent application Ser. No. 14/051,796 filed Oct. 11, 2013 entitled "Apparatus and Method for a Self-Aligning Chip Placement and Leveling," by Jui Hsieh Lai, et al., the entirety of which is hereby incorporated by reference.

BACKGROUND

Device manufacturers are continually challenged to deliver microchip packages that have low manufacturing costs and offer high quality while meeting ever growing supply demands.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry, various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting.

Device manufacturers are continually challenged to deliver microchip packages that have low manufacturing costs and offer high quality while meeting ever growing supply demands. Conventional chip packages are manufactured using a pick up and place process (also referred to as a pick and place process or a pick and place system for systems implementing the process) that requires high accuracy equipment systems to place chips or chip portions at correct positions for particular manufacturing processes. The costs of such high accuracy pick and place systems increases the costs of manufacturing various microchips and reduces manufacturing throughput over a period of time.

Chip package manufacturing processes often use a polymer compound or molding compound during the manufacturing process. Various applications of the molding compound and/or curing processes associated with setting the molding compound often cause one or more chip package portions to shift from a precisely placed position. Positional shifting during the manufacturing process results in reduced manufacturing process speeds, reduced quality, increased waste, and increased manufacturing costs.

Figure 1:
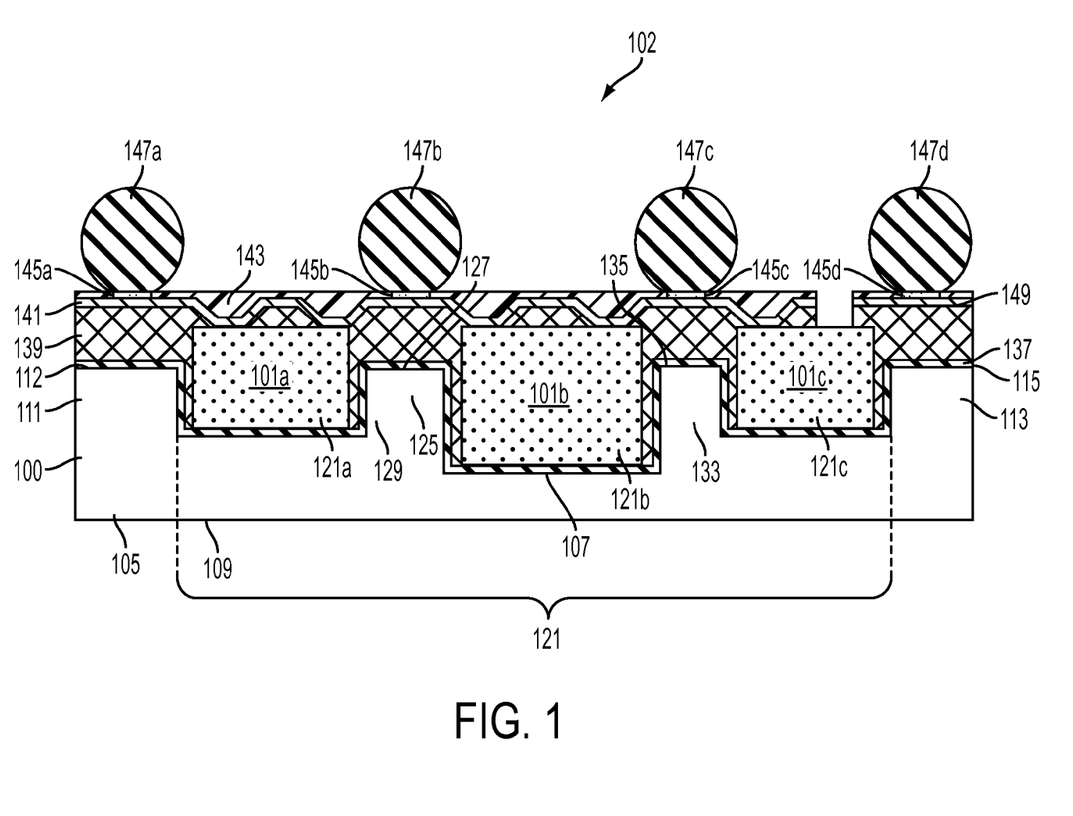
FIG. 1 is a diagram of a cross sectional view of a chip package, in accordance with one or more embodiments.

FIG. 1 illustrates a cross sectional side-view of a chip package chip placement tray 100 embodied as a part of a chip package 102, according to an embodiment. The cross sectional view is taken with respect to cross section A-A' illustrated in either of FIG. 10 or FIG. 11.

The chip placement tray 100 is configured to enable one or more chip package portions 101a-101c (hereinafter collectively referred to as chip package portions 101 where appropriate) to be secured in a predetermined curing position.

The chip placement tray 100 provides an easy way to achieve high accuracy placement and refined positioning for chip package portions 101 without expensive equipment or systems. The chip placement tray 100 is also configured to prevent excessive shifting of the chip package portions 101 during a curing process associated with manufacturing a microchip or chip package having chip package portions 101. Accordingly, in some embodiments, the chip placement tray 100 enables the one or more chip package portions 101 to be secured in a curing position during a curing process within a predetermined tolerance.

In some embodiments, the chip placement tray 100 is configured to be oriented in an upright position for one or more manufacturing processes. In other embodiments, the chip placement tray 100 is configured to be flipped from the upright position such that the chip placement tray 100 is oriented in an inverted position for one or more manufacturing processes.

According to various embodiments, the chip placement tray 100 comprises one or more of silicon, glass, polymer, metal, or other suitable materials. In some embodiments, the chip placement tray 100 is molded. In other embodiments, the chip placement tray 100 is assembled using modular components or layers. In further embodiments, the chip placement tray 100 is formed by an etching process. In some embodiments, the chip placement tray 100 is recycled for future manufacturing processes. In other embodiments, the chip placement tray 100 is configured to at least partially be incorporated into a microchip or chip package that includes one or more chip package portions 101.

According to various embodiments, the chip placement tray 100 includes a base portion 105 having an upper surface 107 and a lower surface 109 opposite the upper surface 107. The chip placement tray 100 also includes a first sidewall portion 111 having a first upper portion 112 distal the upper surface 107 of the base portion 105. The chip placement tray 100 further includes a second sidewall portion 113 having a second upper portion 115 distal the upper surface 107 of the base portion 105. A reservoir 121 is formed between the first sidewall portion 111 and the second sidewall portion 113.

The chip placement tray 100 further includes a third sidewall portion 125 having a third upper portion 127 distal the upper surface 107 of the base portion 105. The third sidewall portion 125 is positioned between the first sidewall portion 111 and the second sidewall portion 113. The chip placement tray 100 additionally includes a fourth sidewall portion 133 having a fourth upper portion 135 distal the upper surface 107 of the base portion 105. The fourth sidewall portion 133 is positioned between the third sidewall portion 125 and the second sidewall portion 113.

In one or more embodiments, the third sidewall portion 125 and the fourth sidewall portion 133 divide the reservoir 121 into a first sub-reservoir 121a, a second-sub reservoir 121b and a third sub-reservoir 121c (collectively referred to as "reservoir 121" where appropriate). The first sub-reservoir 121a is formed between the sidewall portion 111 and the third sidewall portion 125. The first sub-reservoir 121a is configured to accommodate the first chip package portion 101a, for example. The second sub-reservoir 121b is formed between the third sidewall portion 125 and the fourth sidewall portion 133. The second sub-reservoir 121b is configured to accommodate the second chip package portion 101b, for example. The third sub-reservoir 121c is formed between the fourth sidewall portion 133 and the second sidewall portion 113. The third sub-reservoir 121c is configured to accommodate the third chip package portion 101c, for example.

The first sub-reservoir 121a, the second sub-reservoir 121b, and the third sub-reservoir 121c, in some embodiments, are configured to accommodate chip package portions 101 of equal sizes. In other embodiments, the first sub-reservoir 121a, the second sub-reservoir 121b, and third sub-reservoir 121c are configured to accommodate chip package portions 101 of different sizes.

According to various embodiments, the base portion 105 has a thickness between the upper surface 107 and the lower surface 109. The thickness in some embodiments is the same with respect to upper surface 107 associated with the bottom of reservoirs 121. In other embodiments, the thickness is variable with respect to the upper surface 107 associated with the bottom of the various reservoirs 121. In some embodiments, the depth of the reservoirs 121 is the same. In other embodiments, the depth of at least one of the various reservoirs 121 differs from one or more of the other reservoirs. It should be noted that, while illustrated as having three reservoirs 121, in various embodiments the chip placement tray 100 comprises greater or lesser number of sidewall portions and reservoirs.

According to various embodiments, one or more sides and/or surfaces of the first sidewall portion 111, second sidewall portion 113, third sidewall portion 125, and fourth sidewall portion 133 are covered with an adhesive 137. In some embodiments, the adhesive 137 comprises a combination of fluid, polymer, gel, film, or other suitable adhesive material. In some embodiments, the adhesive 137 at least partially fills the reservoirs 121.

In some embodiments, the chip package portions 101 are placed into any of the reservoirs 121. In some embodiments, the chip package portions 101 are placed and secured in a curing position that is associated with the placement of the chip package portions 101 within the reservoirs 121. In some embodiments, the chip package portions 101 are placed into the reservoirs 121 by a dropping process. In some embodiments, the adhesive 137 prevents excessive shifting of the chip package portions 101. Similarly, the sidewall portions 111, 113, 125 and 133 associated with the reservoirs 121 also prevent excessive shifting of the chip package portions 101. Excessive shifting of the chip package portions 101 sometimes occurs, for example, during movement of the chip placement tray 100 having the chip package portions 101 placed into the reservoirs 121 or during another manufacturing process such as a curing process.

In some embodiments, the reservoirs 121 have widths between respective sidewall portions that form the reservoirs 121 configured to enable relatively coarse placement of various chip package portions 101. The widths of the reservoirs 121 allow for a predetermined degree of shift tolerance between the placed position, and the cured, finalized or finishing position of the chip package portions 101 upon completion of the chip package 102.

To form the chip package 102, a molding compound 139 is provided to fill the reservoirs 121 of the chip placement tray 100 to at least cover one or more portions of the chip package portions 101. In some embodiments, the molding compound 139 is provided after the chip package portions 101 are placed into respective reservoirs 121. In other embodiments, some molding compound is added to the reservoirs 121 before the chip package portions 101 are placed into the reservoirs 121. In some embodiments, the molding compound 139 is the adhesive 137. Accordingly, the molding compound 139 is then provided to at least partially cover the chip package portions 101. In some embodiments, the molding compound 139 is provided to completely cover the chip package portions 101.

The sidewall portions associated with the reservoirs 121 limit a degree of movement of the chip package portions 101 at least while the molding compound 139 is provided. The sidewall portions associated with the reservoirs 121 also limit the degree of movement of the chip package portions 101 during a curing process associated with solidifying or setting the molding compound 139. The adhesive 137 further limits the movement of the chip package portions 101 to either no movement or a degree of movement that is within a predetermined tolerance. Accordingly, one or more of the reservoirs 121 and the adhesive 137 secure the chip package portions 101 in respective curing positions before and during a curing process.

The molding compound 139 is provided to secure the chip package portions 101 in the curing position, which is the position at which the chip package portions 101 are placed, or at least within the predefined tolerance. The molding compound 139, in some embodiments, comprises a polymer that is subjected to a curing process that solidifies the molding compound 139.

According to various embodiments, one or more dielectric layers 141, redistribution layers 143, under bump layers 145a-145d (hereinafter collectively referred to as under bump layer 145 where appropriate), under bumps 147a-147d (hereinafter collectively referred to as under bump 147 where appropriate), or any combination thereof, are formed on one or more of the chip package portions 101 and the molding compound 139 at a time when the chip package portions 101 are secured in the curing positions. In some embodiments, the curing positions are at least generally in an aligned and leveled state with respect to an intended finishing position. In some embodiments, one or more of the dielectric layers 141, redistribution layers 143, under bump layer 145, and under bumps 147 are formed on one or more of the chip package portions 101 and the molding compound 139 after the molding compound 139 is cured.

According to various embodiments, the molding compound 139 is subjected to a planarization process to form a planarized region 149 on the molding compound 139 prior to forming the dielectric layers 141, redistribution layers 143, under bump layer 145, and under bumps 147. The dielectric layers 141, redistribution layers 143, under bump layer 145, and under bumps 147, accordingly, are formed on the planarized region 149. In other embodiments, dielectric layers 141, redistribution layers 143, under bump layer 145, and under bumps 147 are formed without performing a planarization process. The dielectric layers 141, redistribution layers 143, under bump layer 145, and under bumps 147 can be formed without first performing a planarization process because the chip package portions 101 secured in the curing positions.

In some embodiments, the chip placement tray 100 is incorporated into the final chip package 102. In other embodiments, the chip placement tray 100 is removed after formation of the dielectric layers 141, redistribution layers 143, under bump layer 145, and under bumps 147 for recycling.

Figure 2:
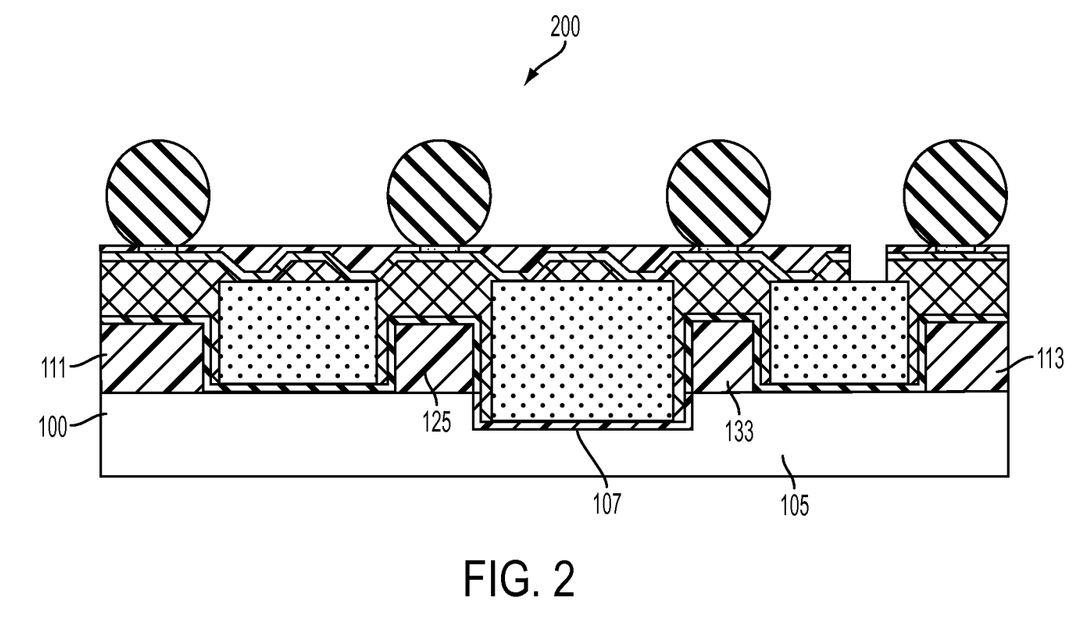
FIG. 2 is a diagram of a cross sectional view of a chip package, in accordance with one or more embodiments.

FIG. 2 is cross sectional view of a chip package 200, according to an example embodiment. The cross sectional view is taken with respect to cross section A-A' illustrated in either of FIG. 10 or FIG. 11.

Chip package 200 is similar to chip package 102 (FIG. 1). Chip package 200; however, includes a chip placement tray 100 having a first sidewall portion 111, second sidewall portion 113, third sidewall portion 125 and fourth sidewall portion 133 that are formed on the upper surface 107 of the base portion 105 formed of a photoresist material. According to various embodiments, such as in this example, the first sidewall portion 111, second sidewall portion 113, third sidewall portion 125 and fourth sidewall portion 133 are formed comprising at least one different material than the base portion 105.

Figure 3:
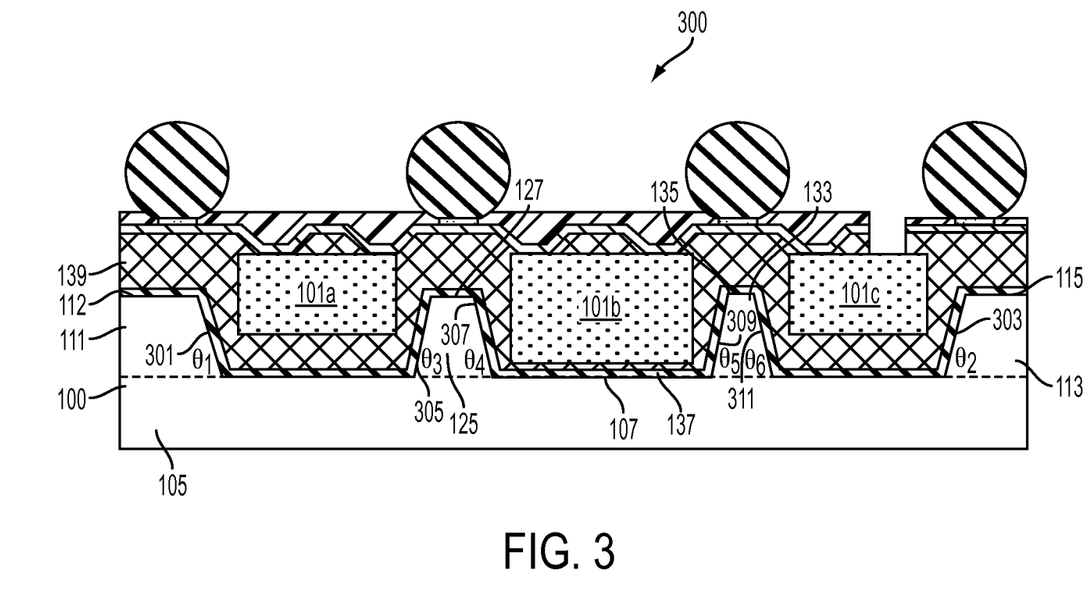
FIG. 3 is a diagram of cross sectional view of a portion of a chip package, in accordance with one or more embodiments.

FIG. 3 is cross sectional view of a chip package 300, according to an example embodiment. The cross sectional view is taken with respect to cross section A-A' illustrated in either of FIG. 10 or FIG. 11.

Chip package 300 is similar to chip package 102 (FIG. 1). Chip package 300, however, includes a chip placement tray 100 that has slanted portions associated with the first sidewall portion 111, second sidewall portion 113, third sidewall portion 125 and fourth sidewall portion 133.

For example, a first slanted portion 301 faces in a direction toward the second sidewall portion 113 and extends from the first upper portion 112 of the first sidewall portion 111 toward the upper surface 107 of the base portion 105 at a first angle $\theta_1$. A second slanted portion 303 faces in a direction toward the first sidewall portion 111 and extends from the second upper portion 115 of the second sidewall portion 113 toward the upper surface 107 of the base portion 105 at a second angle $\theta_2$.

Additionally, a third slanted portion 305 facing in a direction toward the first sidewall portion 111 extends from the third upper portion 127 of the third sidewall portion 125 toward the upper surface 107 of the base portion 105 at a third angle $\theta_3$. A fourth slanted portion 307 facing in a direction toward the second sidewall portion 111 extends from the third upper portion 127 of the third sidewall portion 125 toward the upper surface 107 of the base portion 105 at a fourth angle $\theta_4$. A fifth slanted portion 309 faces in a direction toward the first sidewall portion 111 and extends from the fourth upper portion 135 of the fourth sidewall portion 133 toward the upper surface 107 of the base portion 105 at a fifth angle $\theta_5$. A sixth slanted portion 311 facing in a direction toward the second sidewall portion 113 and extending from the fourth upper portion 135 of the fourth sidewall portion 133 toward the upper surface 107 of the base portion 105 at a sixth angle $\theta_6$.

According to various embodiments, the first sub-reservoir 121a, the second sub-reservoir 121b and the third sub-reservoir 121d have a same width throughout the depth of the reservoirs 121. In other embodiments, the reservoirs 121 have differing widths at the respective bottoms of the reservoirs 121, but the same width between upper portions of the sidewall portions that form the reservoirs 121. In further embodiments, the reservoirs 121 have differing widths between upper portions of the sidewall portions that form the reservoirs 121, but a same width at the bottom of the reservoirs 121.

As such, in some embodiments, the first angle $\theta_1$, the second angle $\theta_2$, the third angle $\theta_3$, fourth angle $\theta_4$, the fifth angle $\theta_5$ and the sixth angle $\theta_6$ are equal to one another. In other embodiments, one or more of the first angle $\theta_1$, the second angle $\theta_2$, the third angle $\theta_3$, fourth angle $\theta_4$, the fifth angle $\theta_5$ and the sixth angle $\theta_6$ are different from one another. In some embodiments, the angles of the slanted portions are configured to cause one or more of the chip package portions 101 to align with a center of a reservoir 121 in which a chip package portion 101 is placed. In other embodiments, some angles associated with a same reservoir 121 differ to drive a chip package portion 101 to be aligned off-center with respect to a center of the reservoir 121 in which a chip package portion 101 is placed.

In some embodiments, the first sub-reservoir 121a is formed between the first slanted portion 301 and the third slanted portion 305, the second sub-reservoir 121b is formed between the fourth slanted portion 307 and the fifth slanted portion 309, and the third sub-reservoir is formed between the sixth slanted portion 311 and the second slanted portion 303.

In at least some embodiments, the first sub-reservoir 121a, the second sub-reservoir 121b, and the third sub-reservoir 121c are configured to accommodate chip package portions 101 of various sizes because the slanted side portions allow for some variability in the geometries of the chip package portions 101, for example. Additionally, the slanted portions prevent excess movement of the chip package portions 101 during movement of the chip placement tray 100 for any manufacturing processes and/or during a curing process associated with curing the molding compound 139. The chip package portions 101 are secured in the curing position by the slanted portions because the geometry of the chip package portions 101 contact the slanted portions of the sidewall portions associated with the reservoirs 121. If there is any movement that occur while the molding compound 139 is provided to the reservoirs 121, the chip package portions 101 will settle toward the bottom of the reservoirs 121 to a point that the slanted portions of the sidewall portions allow. Additionally, the adhesive 137, further prevents excessive movement of the chip package portions. Accordingly, the chip package portions 101 are secured in respective curing positions by the chip placement tray 100.

The slanted structure of the reservoirs 121, in this example, also allow for coarse positional placement of the chip package portions 101 into the reservoirs 121, thereby reducing manufacturing time and eliminating the need for high accuracy pick and place equipment. In some embodiments, a chip package portion 101 is dropped into a reservoir 121, the chip package portion 101 is caused to align with the reservoir 121 in accordance with the slopes and angles associated with the slanted portions of the sidewall portions that form the reservoirs 121, and secured in an intended curing position to form the chip package 300.

For example, in some embodiments, regardless of size of particular chip package portions 101, the first sub-reservoir 121a is configured to cause the first chip package portion 101a to align with respect to a center of the first sub-reservoir 121a based on a relationship between the first chip package portion 101a, the first angle $\theta_1$ and the third angle $\theta_3$. The second sub-reservoir 121b is configured to cause the second chip package portion 101b to align with respect to a center of the second sub-reservoir 121b based on a relationship between the second chip package portion 101b, the fourth angle $\theta_4$, and the fifth angle $\theta_5$, and the third sub-reservoir 121c is configured to cause the third chip package portion 101c to align with respect to a center of the third sub-reservoir 121c based on a relationship between the third chip package portion 101c, the second angle $\theta_2$, and the sixth angle $\theta_6$.

Figure 4:
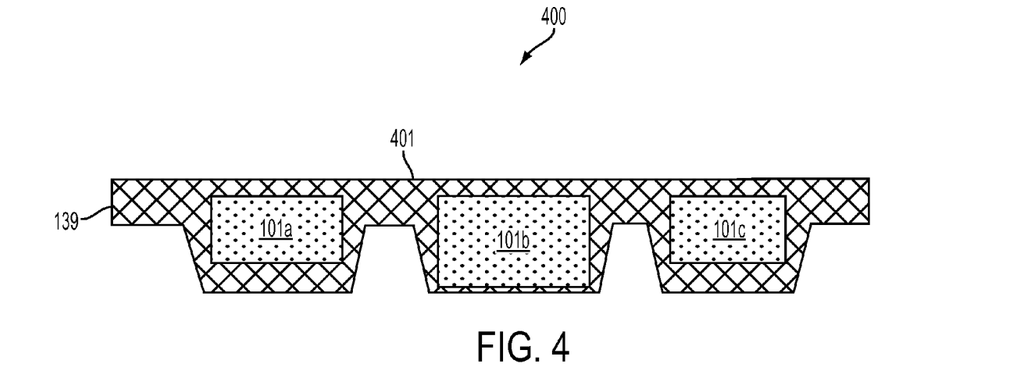
FIG. 4 is a diagram of a cross sectional view of a portion of a chip package, in accordance with one or more embodiments.

FIG. 4 is cross sectional view of a chip package 400, according to an example embodiment. The cross sectional view is taken with respect to cross section A-A' illustrated in either of FIG. 10 or FIG. 11.

Chip package 400 includes the molding compound 139 after the molding compound 139 and the chip package portion 101 are removed from the chip placement tray 100 (FIG. 1).

The molding compound 139 is cured to secure the chip package portions 101 in the aligned and leveled state before removing the cured combination of the molding compound 139 and the chip package portions 101 from the chip placement tray 100.

In some embodiments, the molding compound 139 is subjected to a planarization process that forms a planarized region 401 on at least a portion of the molding compound 139. In some embodiments, the planarized region 401 is formed before the chip placement tray 100 is removed. In other embodiments, the molding compound is subjected to the planarization process that forms the planarized region 401 after the chip placement tray 100 is removed. The planarized region 401 can be formed by way of a grinding process, trimming process, molding process, or any combination thereof, for example.

In either example, removal of the chip placement tray 100 facilitates recycling of the chip placement tray 100 for future use.

Figure 5:
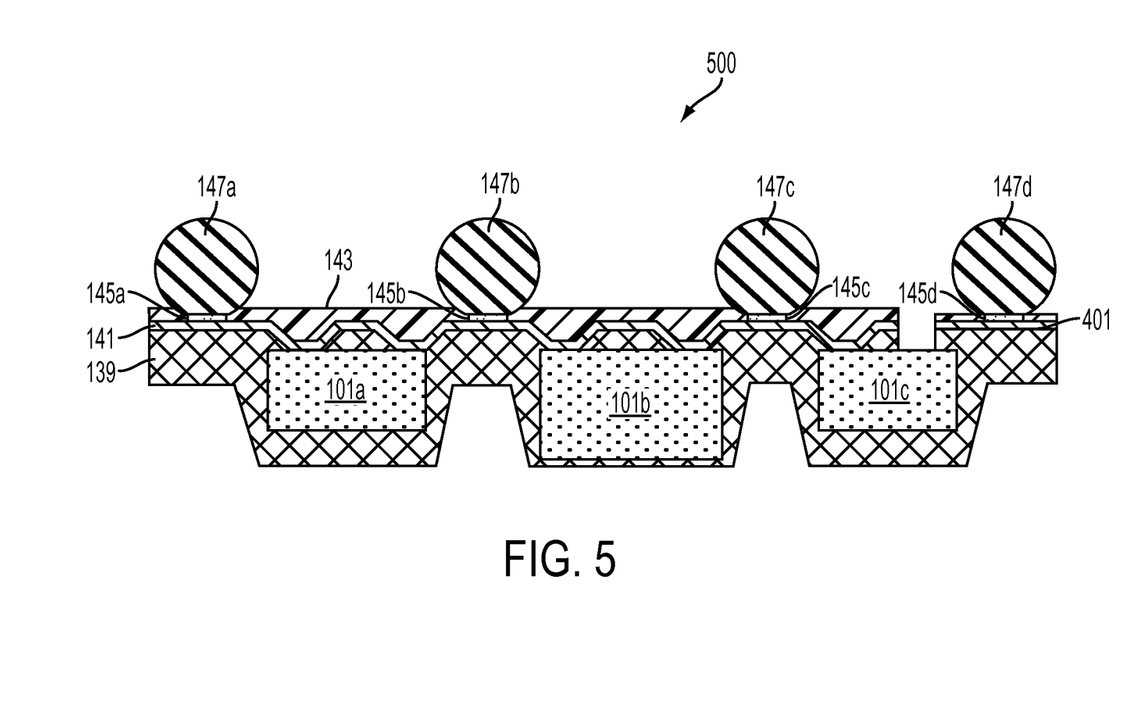
FIG. 5 is a diagram of cross sectional view of a chip package, in accordance with one or more embodiments.

FIG. 5 is a cross sectional view of a chip package 500, according to an example embodiment. The cross sectional view is taken with respect to cross section A-A' illustrated in either of FIG. 10 or FIG. 11. Chip package 500 has one or more dielectric layers 141, redistribution layers 143, under bump layer 145, and under bumps 147 formed on one or more of the chip package portions 101 and the planarized region 401 on the molding compound 139. In this example, the final chip package 500 is one that excludes the chip placement tray 100.

Figure 6:
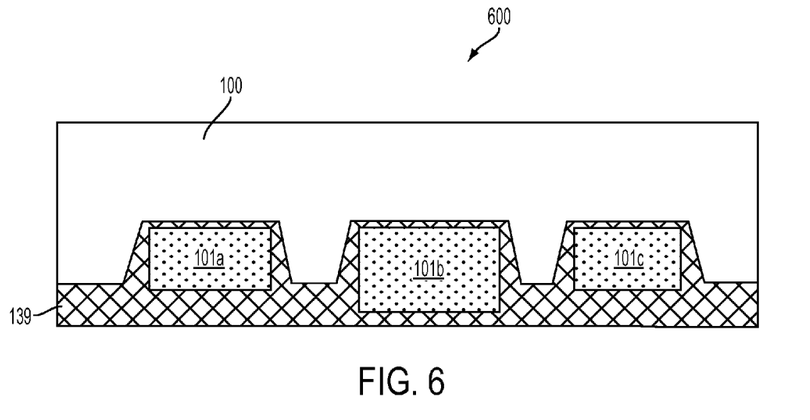
FIG. 6 is a diagram of cross sectional view of a portion of a chip package, in accordance with one or more embodiments.

FIG. 6 is a cross sectional view of a portion of a chip package 600, according to an example embodiment. The cross sectional view is taken with respect to cross section A-A' illustrated in either of FIG. 10 or FIG. 11. The portion of the chip package 600 has the chip placement tray 100 in an inverted position.

According to various embodiments, the chip placement tray 100 is configured to be flipped from the upright position discussed above with respect to chip package 300 to the inverted position such that the chip placement tray 100, the molding compound 139 having been cured, and the chip package portions 101 are in the inverted position while maintaining the chip package portion 101 in the curing position. In some embodiments, the cured molding compound 139 and the chip package portions 101 are secured within the reservoirs 121 during the inversion.

Figure 7:
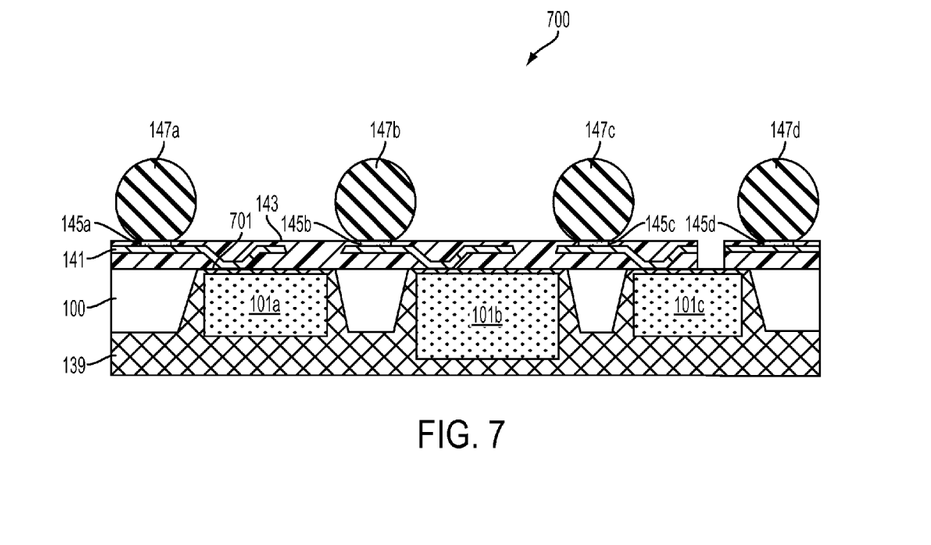
FIG. 7 is a diagram of a cross sectional view of a chip package, in accordance with one or more embodiments.

FIG. 7 is cross sectional view of a chip package 700, according to an example embodiment. The cross sectional view is taken with respect to cross section A-A' illustrated in either of FIG. 10 or FIG. 11. The chip package 700 includes one or more dielectric layers 141, redistribution layers 143, under bump layer 145, and under bumps 147 formed on one or more of the chip package portions 101, and the molding compound 139 following an inversion such as that discussed above with respect to chip package 600.

According to various embodiments, the molding compound 139 and the chip placement tray are subjected to a planarization process, such as that discussed above, to form a planarized region 701 on the molding compound 139 and the chip placement tray 100 prior to forming the dielectric layers 141, redistribution layers 143, under bump layer 145, and under bumps 147. The dielectric layers 141, redistribution layers 143, under bump layer 145, and under bumps 147, accordingly, are formed on the planarized region 701.

In other embodiments, dielectric layers 141, redistribution layers 143, under bump layer 145, and under bumps 147 are formed without performing a planarization process directly onto the lower surface 109. In at least some embodiments, the dielectric layers 141, redistribution layers 143, under bump layer 145, and under bumps 147 are formed without first performing a planarization process because the chip package portions 101 are in the curing position and generally aligned with respect to reservoirs 121.

In this example, the final chip package 700 includes at least a portion of the chip placement tray 100.

Figure 8:
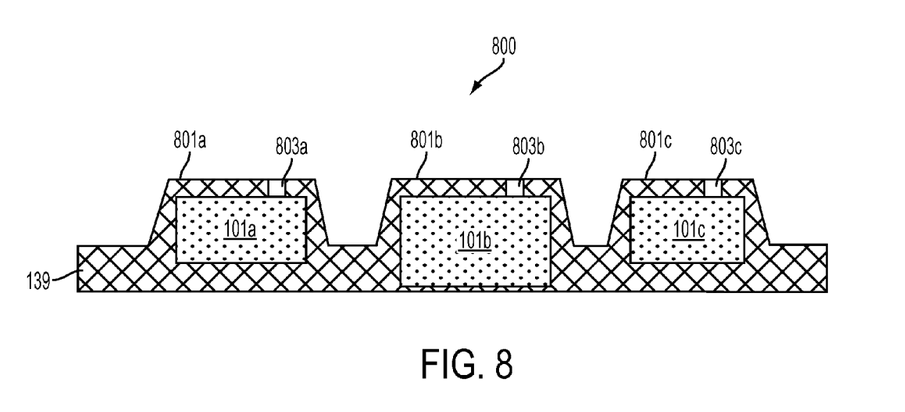
FIG. 8 is a diagram of cross sectional view of a portion of a chip package, in accordance with one or more embodiments.

FIG. 8 is a cross sectional view of a portion of a chip package 800, according to an example embodiment. The cross sectional view is taken with respect to cross section A-A' illustrated in either of FIG. 10 or FIG. 11. The portion of a chip package 800 includes the molding compound 139 and the chip package portions 101 following an inversion such as that discussed above with respect to chip package 600 and the molding compound 139 and the chip package portions 101 are removed from the chip placement tray 100. The molding compound 139 is cured to secure the chip package portions 101 in the curing position before inverting the chip placement tray 100 and removing the cured combination of the molding compound 139 and the chip package portions 101 from the chip placement tray 100.

In some embodiments, the molding compound 139 is subjected to a planarization process, such as that discussed above, that forms planarized regions 801a, 801b and 801c (hereinafter collectively referred to as planarized region 801 where appropriate) on one or more portions of the molding compound 139. The molding compound 139 is subjected to the planarization process that forms the planarized region 801 after the chip placement tray 100 is removed. The planarized region 801 is formed by way of a grinding process, trimming process, molding process, or any combination thereof, for example. In some embodiments, the planarized region 801 is formed on one or more of the chip package portions 101. In various embodiments, through vias 803a, 803b and 803d are formed in the molding compound 139 at the planarized regions 801 to facilitate communication with one or more layers or features formed on the inverted portion of the chip package 800 during a later manufacturing process.

In either example, removal of the chip placement tray 100 facilitates recycling of the chip placement tray 100 for future use.

Figure 9:
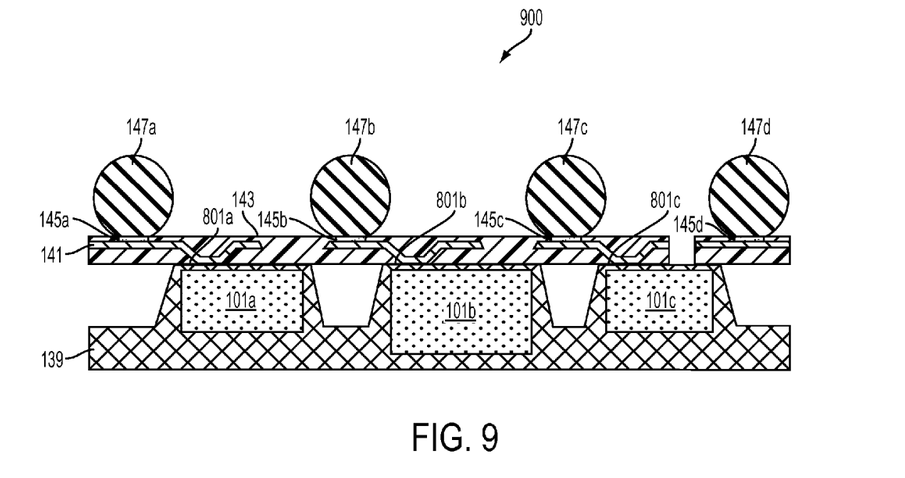
FIG. 9 is a diagram of a cross sectional view of a chip package, in accordance with one or more embodiments.

FIG. 9 is a cross sectional view of a chip package 900, according to an embodiment. The cross sectional view is taken with respect to cross section A-A' illustrated in either of FIG. 10 or FIG. 11. The chip package 900 includes one or more dielectric layers 141, redistribution layers 143, under bump layer 145, and under bumps 147 formed on one or more of the portions of the planarized region 801, discussed above. In this example, the final chip package 900 is one that excludes the chip placement tray 100 and is in an inverted position compared to chip package 500.

Figure 10:
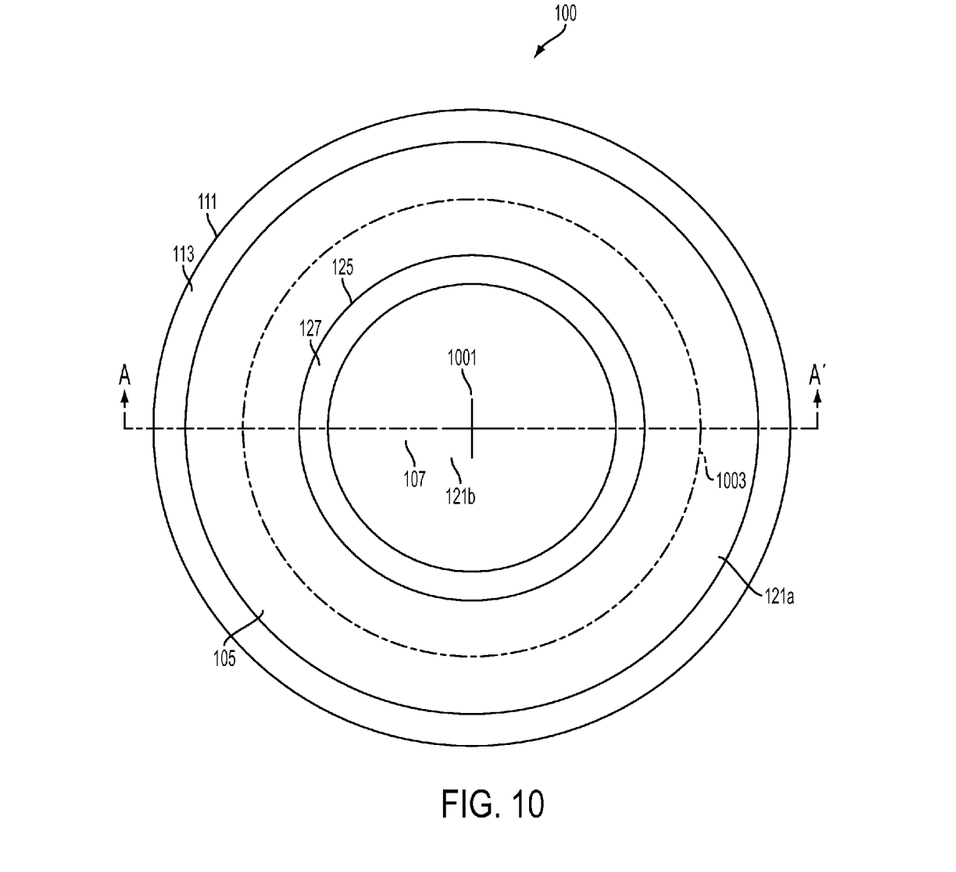
FIG. 10 is a top-side view of a chip placement tray, in accordance with one or more embodiments.

FIG. 10 is a diagram of a top side view of a circular chip placement tray 100, according to an embodiment. A cross-section of circular chip placement tray 100 along cross-section A-A' yields any of the side-views discussed above with regard to FIGS. 1-9.

In this example, chip placement tray 100 includes a circular base portion 105 having an upper surface 107 and a lower surface opposite the upper surface. The chip placement tray 100 also includes a first circular sidewall portion 111 having a first upper portion distal the upper surface 107 of the base portion. The chip placement tray 100 also has a second circular sidewall portion 125 having a second upper portion 127 distal the upper surface 107 of the base portion 105. The second circular sidewall portion 125 has a radius that is less than a radius of the first circular sidewall portion 111. As discussed above, the first and second sidewall portions 111 and 125 comprise slanted portions that either face one another or toward a center 1001 of the first and second circular sidewall portions 111 and 125.

The chip placement tray, in this example, includes a first sub-reservoir 121a and a second sub-reservoir 121b. The first sub-reservoir 121a is formed between the slanted portions of the first sidewall portion 111 and the second sidewall portion 125. The second sub-reservoir 121b is formed within the slanted portion of the second sidewall portion 125.

The first sub-reservoir 121a and the second sub-reservoir 121b are configured to accommodate at least a first chip package portion 101a and a second chip package portion 101b, and cause the first chip package portion 101a to align with respect to a center-line ring 1003 of the first sub-reservoir 121a and cause the second chip package portion 101b to align with respect to a center of the second sub-reservoir 121b.

It should be noted that while depicted as being circular in this top-side view, the chip placement tray 100, or any components thereof such as, but not limited to the base portion and any sidewall portions, may be any other shape such as, but not limited to, rectangular, square, triangular, trapezoidal, hexagonal, or any other polygon. Similarly, the chip placement tray 100, or any components thereof such as, but not limited to the base portion and any sidewall portions may be oval, partially arced, or comprise any combination of curved and straight edges.

Figure 11:
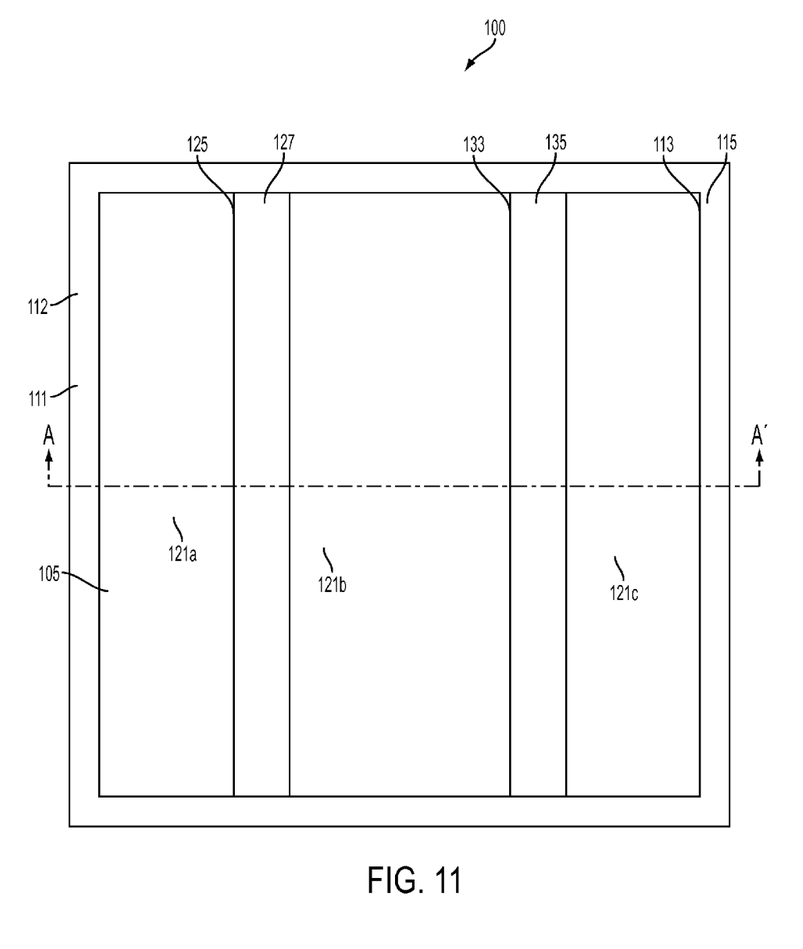
FIG. 11 is a top-side view of a chip placement tray, in accordance with one or more embodiments.

FIG. 11 is a diagram of a top side view of a square chip placement tray 100, according to an embodiment. A cross-section of circular chip placement tray 100 along cross-section A-A' yields any of the side-views discussed above with regard to FIGS. 1-9.

In this example, chip placement tray 100 includes base portion 105 having an upper surface 107 and a lower surface opposite the upper surface. The chip placement tray 100 also includes a first sidewall portion 111 having a first upper portion 112 distal the upper surface 107 of the base portion. The chip placement tray 100 also has a second sidewall portion 113 having a second upper portion 115 distal the upper surface 107 of the base portion 105. The chip placement tray 100 further includes a third sidewall portion 125 having a third upper portion 127 distal the upper surface 107 of the base portion 105 and a fourth sidewall portion 133 having a fourth upper portion 135 distal the upper surface 107 of the base portion 105. As discussed above, the first, second, third and fourth sidewall portions 111, 113, 125 and 133 comprise slanted portions that face one another as described above.

The chip placement tray 100, in this example, includes the first sub-reservoir 121a, the third sub-reservoir 121ba and the fourth sub-reservoir 121bb, discussed above.

Figure 12:
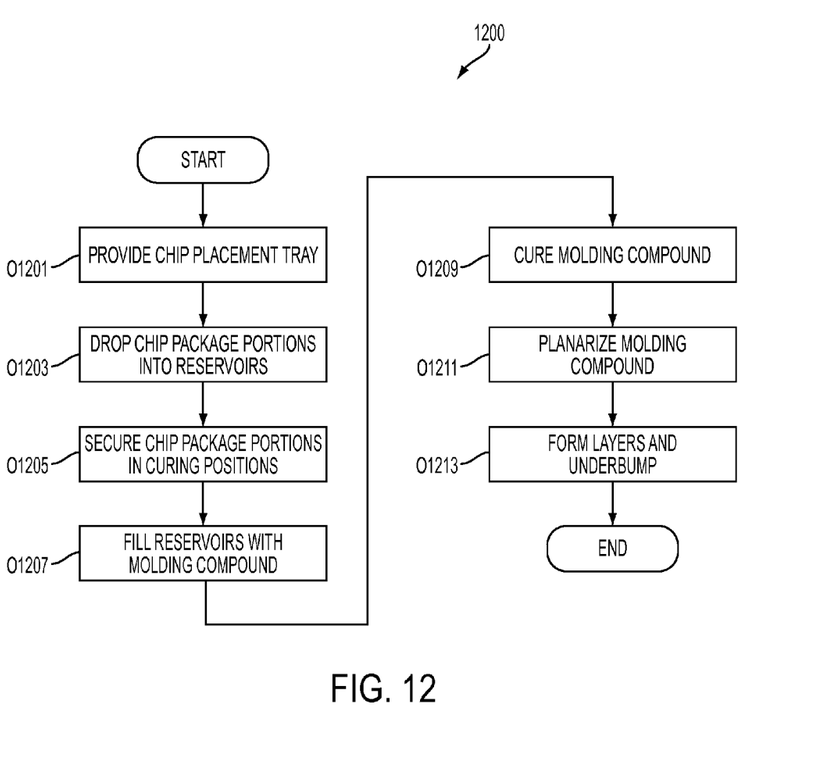
FIG. 12 is a process associated with forming at least a portion of a chip package having one or more chip package portions secured in a curing position during a curing process, in accordance with one or more embodiments.

FIG. 12 is a flowchart of a process 1200 for forming at least a portion of a chip package having one or more chip package portions secured in a curing position during a curing process associated with solidifying a molding compound, according to an embodiment.

The process begins with operation O1201 in which an apparatus such as chip placement tray 100 is provided. The process continues with operation O1203 in which a first chip package portion is placed into a first reservoir, a second chip package portion is placed into a second reservoir, and a third chip package portion is placed into a third reservoir. Then, in operation O1205, the first chip package portion is caused to be secured in a first curing position, the second chip package portion is caused to be secured in a second curing position and the third chip package portion is caused to be secured in a third curing position. In one or more embodiments, at least portions of the first reservoir, the second reservoir and the third reservoir are coated with an adhesive to secure the first chip package portion in the first curing position, the second chip package portion in the second curing position and the third chip package portion in the third curing position.

Next, in operation O1207, the first reservoir, the second reservoir and the third reservoir are filled, at least partially, with a molding compound. Then, in operation O1209, the molding compound is cured. In one or more embodiments, the cured molding compound and first chip package portion, second chip package portion and third chip package portion are flipped from a first orientation to a second orientation following the curing process. In operation O1211, a planarization process is performed on the cured molding compound to form a planarized region on the molding compound. The process continues to operation O1213 in which one or more of a dielectric layer, a redistribution layer, an under bump layer, and an under bump are formed on one or more of the chip package portion and the planarized region on the molding compound. In embodiments, the cured molding compound, the first chip package portion, the second chip package portion and the third chip package portion are released from the first reservoir, the second reservoir and the third reservoir.

One aspect of this description relates to an apparatus having a base portion having an upper surface and a lower surface opposite the upper surface. The apparatus also has a first sidewall portion having a first upper portion distal the upper surface of the base portion. The apparatus additionally has a second sidewall portion having a second upper portion distal the upper surface of the base portion. The apparatus further has a third sidewall portion having a third upper portion distal the upper surface of the base portion, the third sidewall portion being positioned between the first sidewall portion and the second sidewall portion.

The apparatus also has a fourth sidewall portion having a fourth upper portion distal the upper surface of the base portion, the fourth sidewall portion being positioned between the third sidewall portion and the second sidewall portion. The apparatus further has a first reservoir formed between the first sidewall portion and the second sidewall portion, the first reservoir configured to receive a first chip package portion and to secure the first chip package portion in a first curing position. The apparatus additionally has a second reservoir formed between the second sidewall portion and the third sidewall portion, the second reservoir configured to receive a second chip package portion and to secure the second chip package portion in a second curing position. The apparatus also has a third reservoir formed between the third sidewall portion and the fourth sidewall portion, the third reservoir configured to receive a third chip package portion and to secure the third chip package portion in a third curing position.

Another aspect of this description relates to a method that involves providing an apparatus comprising a first reservoir configured to receive a first chip package portion and to secure the first chip package portion in a first curing position, a second reservoir configured to receive a second chip package portion and to secure the second chip package portion in a second curing position, and a third reservoir configured to receive a third chip package portion and to secure the third chip package portion in a third curing position. The method also involves placing the first chip package portion into the first reservoir, the second chip package portion into the second reservoir, and the third chip package portion into the third reservoir. The method further involves causing the first chip package portion to be secured in the first curing position, the second chip package portion to be secured in the second curing position and the third chip package portion to be secured in the third curing position.

Still another aspect of this description relates to an apparatus that has a chip placement tray comprising a first reservoir a second reservoir and a third reservoir. The apparatus also has a first chip package portion secured within the first reservoir. The apparatus further has a second chip package portion secured within the second reservoir. The apparatus additionally has a third chip package portion secured within the third reservoir. The apparatus also has a molding compound covering the first chip package portion, the second chip package portion, the third chip package portion and the chip placement tray. The apparatus further has an adhesive within the first reservoir, the second reservoir and the third reservoir, the adhesive and the first reservoir, the second reservoir and the third reservoir being configured to secure the first chip package portion in a first curing position, the second chip package portion in a second curing position and the third chip package portion in a third curing position at least while the molding compound is added to the chip package and the molding compound is cured.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An apparatus comprising:
a base portion having an upper surface and a lower surface, the lower surface opposite the upper surface;
a first sidewall portion having a first upper portion distal the upper surface of the base portion;
a second sidewall portion having a second upper portion distal the upper surface of the base portion;
a third sidewall portion having a third upper portion distal the upper surface of the base portion, the third sidewall portion being positioned between the first sidewall portion and the second sidewall portion;
a fourth sidewall portion having a fourth upper portion distal the upper surface of the base portion, the fourth sidewall portion being positioned between the third sidewall portion and the second sidewall portion;
a first reservoir formed between the first sidewall portion and the second sidewall portion, the first reservoir configured to receive a first chip package portion and to secure the first chip package portion in a first curing position;
a second reservoir formed between the second sidewall portion and the third sidewall portion, the second reservoir configured to receive a second chip package portion and to secure the second chip package portion in a second curing position; and
a third reservoir formed between the third sidewall portion and the fourth sidewall portion, the third reservoir configured to receive a third chip package portion and to secure the third chip package portion in a third curing position.

2. The apparatus of claim 1, wherein at least portions of the first sidewall portion, the second sidewall portion, the third sidewall portion, and the fourth sidewall portion are coated with an adhesive to secure the first chip package portion in the first curing position, the second chip package portion in the second curing position and the third chip package portion in the third curing position.

3. The apparatus of claim 1, wherein the base portion and the first sidewall, the second sidewall, the third sidewall and the fourth sidewall comprise a same material.

4. The apparatus of claim 1, wherein the first sidewall, the second sidewall, the third sidewall and the fourth sidewall comprise a photo resist.

5. The apparatus of claim 1, wherein at least one of the first reservoir, the second reservoir and the third reservoir are formed having a pair of slanted sidewall portions, the pair of slanted sidewall portions being configured to cause at least one of the first chip package portion, the second chip package portion and the third chip package portion to align with respect to one or more of a center of the first reservoir, a center of the second reservoir and a center of a the third reservoir.

6. The apparatus of claim 1, wherein the first reservoir, the second reservoir and the third reservoir are configured to have one or more differing depths.

7. The apparatus of claim 1, wherein the first reservoir, the second reservoir and the third reservoir are further configured to accommodate a molding compound to secure the first chip package portion in the first curing position, the second chip package portion in the second curing position and the third chip package portion in the third curing position.

8. The apparatus of claim 7, wherein one or more of a dielectric layer, a redistribution layer, an under bump layer, and an under bump are formed on one or more of the first chip package portion, the second chip package portion, the third chip package portion and the molding compound.

9. The apparatus of claim 8, wherein the molding compound is cured before forming one or more of the dielectric layer, the redistribution layer, the under bump layer, and the under bump.

10. The apparatus of claim 9, the molding compound being subjected to a planarization process to form a planarized region on the molding compound, and one or more of the dielectric layer, the redistribution layer, the under bump layer, and the under bump are formed on the planarized region.

11. The apparatus of claim 10, wherein the chip package and the molding compound are removed from the first reservoir before the planarization process.

12. The apparatus of claim 1, wherein the first reservoir, the second reservoir and the third reservoir are further configured to accommodate a molding compound and to be flipped from a first orientation to a second orientation while maintaining the first chip package portion, the second chip package portion and the third chip package portion in the secured first curing position, the second curing position and the third curing position.

13. The apparatus of claim 12, wherein at least a portion of the molding compound is subjected to a planarization process to form a planarized region on at least a portion of the molding compound, and one or more of a dielectric layer, a redistribution layer, an under bump layer, and an under bump are formed on the planarized region.

14. The apparatus of claim 13, wherein the apparatus is configured to release the molding compound and the first chip package portion, the second chip package portion and the third chip package portion, to enable the molding compound to be subjected to a planarization process to form the planarized region.

15. A method using an of apparatus, the apparatus comprising a first reservoir configured to receive a first chip package portion and to secure the first chip package portion in a first curing position, a second reservoir configured to receive a second chip package portion and to secure the second chip package portion in a second curing position, and a third reservoir configured to receive a third chip package portion and to secure the third chip package portion in a third curing position, wherein the method comprises:
   placing the first chip package portion into the first reservoir, the second chip package portion into the second reservoir, and the third chip package portion into the third reservoir; and
   causing the first chip package portion to be secured in the first curing position, the second chip package portion to be secured in the second curing position and the third chip package portion to be secured in the third curing position.

16. The method of claim 15, wherein at least portions of the first reservoir, the second reservoir and the third reservoir are coated with an adhesive to secure the first chip package portion in the first curing position, the second chip package portion in the second curing position and the third chip package portion in the third curing position.

17. The method of claim 16, further comprising:
   filling the first reservoir, the second reservoir and the third reservoir, at least partially, with a molding compound;
   curing the molding compound;
   performing a planarization process on the cured molding compound to form a planarized region on the molding compound; and
   forming one or more of a dielectric layer, a redistribution layer, an under bump layer, and an under bump on one or more of the chip package portion and the planarized region on the molding compound.

18. The method of claim 17, further comprising:
   flipping the apparatus from a first orientation to a second orientation.

19. The method of claim 18, further comprising:
   releasing the cured molding compound, the first chip package portion, the second chip package portion and the third chip package portion from the first reservoir, the second reservoir and the third reservoir.

20. A chip package comprising:
   a chip placement tray comprising a first reservoir, a second reservoir, and a third reservoir;
   a first chip package portion secured within the first reservoir;
   a second chip package portion secured within the second reservoir;
   a third chip package portion secured within the third reservoir;
   a molding compound covering the first chip package portion, the second chip package portion, the third chip package portion and the chip placement tray; and
   an adhesive within the first reservoir, the second reservoir and the third reservoir, the adhesive and the first reservoir, the second reservoir and the third reservoir being configured to secure the first chip package portion in a first curing position, the second chip package portion in a second curing position and the third chip package portion in a third curing position at least while the molding compound is added to the chip package and the molding compound is cured.

\* \* \* \* \*